(12) United States Patent
Mentesana

(10) Patent No.: US 11,689,393 B1
(45) Date of Patent: Jun. 27, 2023

(54) NEAR-ZERO LATENCY ANALOG BI-QUAD INFINITE IMPULSE RESPONSE FILTER

(71) Applicant: The Boeing Company, Chicago, IL (US)

(72) Inventor: Nicholas Mentesana, Manchester, MO (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 17/586,668

(22) Filed: Jan. 27, 2022

(51) Int. Cl.
*H04L 25/03* (2006.01)
*H03H 21/00* (2006.01)
*H04L 25/02* (2006.01)

(52) U.S. Cl.
CPC ... *H04L 25/03261* (2013.01); *H03H 21/0001* (2013.01); *H04L 25/0212* (2013.01)

(58) Field of Classification Search
CPC .......... H04L 25/03261; H04L 25/0212; H03H 21/0001
USPC ....................................................... 375/262
See application file for complete search history.

(56) References Cited

U.S. PATENT DOCUMENTS 11,070,351 B1 * 7/2021 Chepuri .............. H04L 25/4917

* cited by examiner

*Primary Examiner* — Fitwi Y Hailegiorgis
(74) *Attorney, Agent, or Firm* — Barta, Jones & Foley, PLLC

(57) ABSTRACT

Examples provide a method and apparatus for an analog bi-quad infinite impulse response (IIR) filter. An amplifier generates a positive output signal corresponding to a received RF signal and a negative output signal. A set of selectively switchable time-delay circuits associated with a positive arm of the filter causes a predetermined delay corresponding to a desired sample frequency. A first set of configurable variable gain amplifiers amplify the positive output signal to establish a set of positive coefficients. A set of selectively switchable time-delay circuits associated with a negative arm of the filter causes a predetermined delay. A delayed negative output signal is generated which is amplified by a second set of configurable variable gain amplifiers to establish a set of negative coefficients. A set of power combiners function as sum junctions to combine the delayed positive output signals and the delayed negative output signals into a single output signal.

20 Claims, 11 Drawing Sheets

US 11,689,393 B1

NEAR-ZERO LATENCY ANALOG BI-QUAD INFINITE IMPULSE RESPONSE FILTER

BACKGROUND

Field-programmable gate arrays (FPGAs) and digital signal processors (DSPs) have largely cornered the market for processing digital signals. While these integrated circuits (ICs) and digital processors have amazing capabilities, they all suffer from the burden of latency caused by the conversion of analog signals to digital signals for processing and the converting back from digital to analog. To use a digital architecture for processing an analog input signal, the analog input signal must, at a minimum, be converted to digital by an analog-to-digital converter (ADC), passed through the digital communication protocols to enter one or more processing cores, undergo processing algorithms, and then be converted back to analog by a digital-to-analog converter (DAC). Each of these steps introduces latency to the analog signal. This ADC conversion and then DAC conversion back is a time-consuming process that results in latency, increased noise due to A-D and D-A conversions, as well as other inefficiencies within a signal processing.

SUMMARY

The disclosed examples are described in detail below with reference to the accompanying drawing figures listed below. The following summary is provided to illustrate implementations disclosed herein. It is not meant, however, to limit all examples to any particular configuration or sequence of operations.

Some aspects and implementations disclosed herein are directed at an analog bi-quad infinite impulse response (IIR) filter. An implementation includes an amplifier that receives an analog input signal. The amplifier generates a positive output signal corresponding to the received analog input signal and a negative output signal that is a negative of the received analog input signal. A set of time-delay circuits cause a configurable time-delay corresponding to a desired sample frequency. A first set of variable gain amplifiers amplify the positive output signal to generate delayed positive output signals associated with a set of positive coefficients. A second set of variable gain amplifiers amplify the negative output signal to generate delayed negative output signals associated with a set of negative coefficients. A set of power combiner devices sum each of the delayed positive output signals with each of the delayed negative output signals to create a single combined analog output signal associated with a desired set of positive and negative coefficients.

The features, functions, and advantages that have been discussed are achieved independently in various implementations or are to be combined in yet other implementations, further details of which are seen with reference to the following description and drawings.

BRIEF DESCRIPTION OF THE DRAWINGS

Corresponding reference characters indicate corresponding parts throughout the drawings.

DETAILED DESCRIPTION

Figure 1:
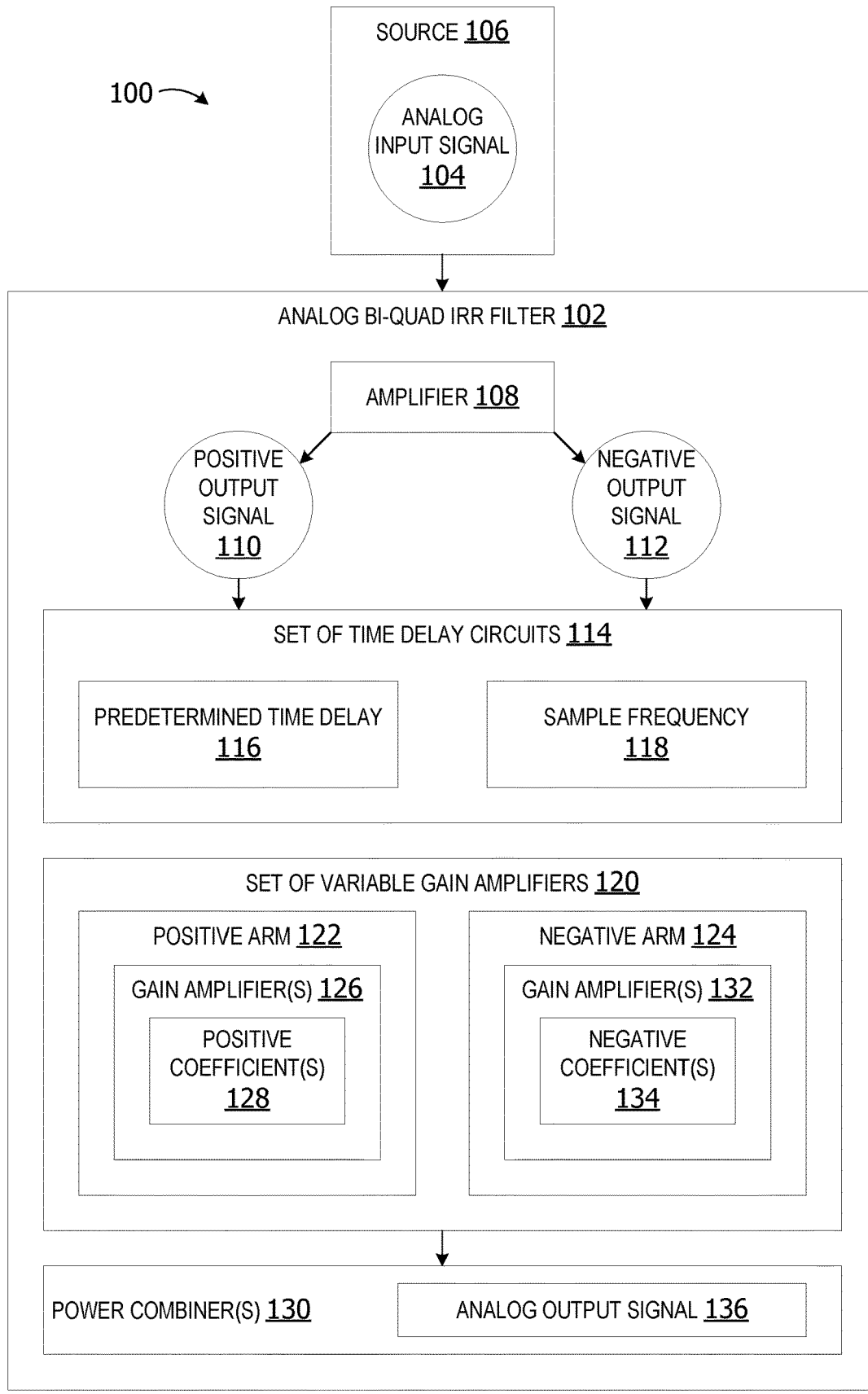
FIG. 1 is an exemplary block diagram illustrating an analog bi-quad infinite IIR filter for sampling and modifying an analog input signal.

The various implementations will be described in detail with reference to the accompanying drawings. Wherever possible, the same reference numbers will be used throughout the drawings to refer to the same or like parts. References made throughout this disclosure relating to specific implementations and implementations are provided solely for illustrative purposes but, unless indicated to the contrary, are not meant to limit all implementations.

The foregoing summary, as well as the following detailed description of certain implementations will be better understood when read in conjunction with the appended drawings. As used herein, an element or step recited in the singular and preceded by the word "a" or "an" should be understood as not necessarily excluding the plural of the elements or steps. Further, references to "one implementation" are not intended to be interpreted as excluding the existence of additional implementations that also incorporate the recited features. Moreover, unless explicitly stated to the contrary, implementations "comprising" or "having" an element or a plurality of elements having a particular property could include additional elements not having that property.

Field programmable gate arrays (FPGAs) and digital signal processors (DSPs) have many useful capabilities for processing digital signals. However, they all suffer from the burden of latency as these digital filters require that a sampled radio frequency (RF) signal is converted from analog to digital, processed by the filter and then converted the result back to RF. This results in a degree of latency that is unacceptable for many applications. In one example, analog-to-digital conversion (ADC) can result in 7.4 nanoseconds (ns). The digital signal processing can then result in 100 ns. The digital-to-analog conversion (DAC) of the output can then result in an additional 4.4 ns of latency. Thus, there appears to be an industry-wide bottleneck of getting data from a bus, into the processing core, and then back out to a bus. This latency reduces system effectiveness.

Aspects of the disclosure provide an analog bi-quad IIR filter device with near-zero latency. The analog bi-quad IIR filter eliminates the need for the ADC and the DAC, where the analog bi-quad IIR filter is able to perform the functions of a digital filter without converting the analog signal to a digital signal. This significantly reduces the latency of the filter system to near-zero latency and reduces noise by eliminating signal-to-noise loss for both ADC and DAC, which is necessary for digital bi-quad filters. Lowering the latency further enables an expansion of how many simultaneous frequencies/range of frequencies (wider bandwidth) the filter system can handle at once.

In other aspects, the analog bi-quad IIR filter includes a bi-quad circuit with configurable time-delay circuits, variable gain amplifiers and power combiners performing the functions of a digital filter. Typical variable attenuators have attenuation-dependent phase. There are commercial off-the-shelf (COTS) variable attenuators that provide uniform phase over attenuation setting. Where a variable attenuation component with uniform phase over attenuation setting is coupled to each gain amplifier, each time delay circuit is selectively switchable between varying attenuation settings to provide uniform time delay and/or linear phase response. This enables increased flexibility and customization of functions.

Other examples enable configurable variable gain amplifiers which enable the user to select whether to eliminate a positive coefficient produced by the positive arm of the filter or a negative coefficient produced by the negative arm via an attenuation of the undesired coefficient. In this manner, the variable gain amplifiers are configured to establish the positive and negative coefficients required for a specified purpose or application.

Still other examples provide selectively switchable time-delay circuits. A switch device enables a user to configure the switch devices to cause a delay corresponding to a desired sample frequency of the input. In this manner, the sample frequency and delay time can be easily and efficiently modified without making changes to the analog bi-quad IIR filter architecture.

Referring more particularly to the drawings, FIG. 1 provides a system 100 including an analog bi-quad IIR filter 102 for sampling and modifying an analog input signal 104 received from an analog source 106. In this example, the analog bi-quad IIR filter 102 is an analog implementation of a configurable analog filter capable of performing the functions of a digital IIR filter.

The source 106 is any type of source for an analog input signal 104. The source 106 can include a human speaker, a microphone device recording audio sounds (audio input), electronic signals, or any other source of analog input signals. The analog input signal 104 is an analog signal associated with information, such as, but not limited to, music, voice, or any other type of signal. In some examples, the analog input signal 104 is a radio frequency (RF) analog input.

An amplifier 108 receives the analog input signal 104. The analog input signal 104 is a positive output signal 110. In this example, the amplifier is a differential amplifier. However, in other examples, the amplifier is implemented as a transformer or a balun for splitting the incoming analog signal into a positive output signal and an equal, but opposite, negative (inverse) signal.

The amplifier 108 creates a negative output signal 112 from the analog input signal 104. The negative output signal 112 is that same or equal to the positive output signal 110 except that the negative output signal 112 is a negative version of the input signal. In some examples, the negative output signal 112 is an inverse of the positive output signal 110.

A set of one or more time-delay circuits 114 includes at least one time-delay circuit coupled to the positive output signal 110 and at least one time-delay circuit coupled to the negative output signal 112. The set of time-delay circuits 114 within the analog bi-quad IIR filter replaces the $z^{-1}$ delays utilized in digital filters. A time-delay circuit provides physical lines or traces causing a total loop to delay equal to the desired sample frequency. For example, if the sample frequency is one giga-sample per-second (GSPS), the time-delay circuit length required to cause a delay corresponding to the sample frequency is calculated as follows:

GSPS=1 GHz=11.8 in. electrical length

2 GSPS=2 GHz=5.9 in. electrical length

The set of time-delay circuits 114 functions to slow the speed with which the positive output signal 110 and/or the negative output signal 112 traverses the time-delay circuit(s) to cause a predetermined time delay 116 corresponding to a desired sample frequency 118. The predetermined time-delay is configurable. The user can design a time-delay circuit in the set of time delay circuits to provide any user-selected time-delay.

The sample frequency 118 is the frequency with which the analog signal, in an equivalent digital filter architecture, is sampled during generation of the digital input. The sample frequency 118 is configurable and can include any user-selected sample frequency 118.

A set of variable gain amplifiers 120 includes a positive arm 122 and a negative arm 124. The positive arm 122 includes one or more variable gain amplifier(s) 126 generating one or more positive coefficient(s) 128. In this example, the variable gain amplifier(s) 126 receive the positive output signal 110 and generate the one or more positive coefficient(s) 128 for output to one or more power combiner(s) 130. The variable gain amplifier(s) 126 are configurable to attenuate one or more of the positive coefficients generated based on the positive output signal 110.

The negative arm 124 includes one or more variable gain amplifier(s) 132 generating one or more negative coefficient(s) 134. In this example, the variable gain amplifier(s) 132 receive the negative output signal 112 and generate the one or more positive coefficient(s) 128 for output to one or more power combiner(s) 130. The variable gain amplifier(s) 132 are configurable to attenuate one or more of the negative coefficients generated based on the negative output signal 112.

The set of variable gain amplifiers 120 replace the multiplication by coefficients used in digital filters to generate negative and positive coefficients. In a digital system, a positive coefficient can be multiplied by a negative one to obtain a negative coefficient. In this analog bi-quad IIR filter, multiplication to obtain negative coefficients is not an option because an analog filter cannot multiply/amplify by a negative number. Therefore, the analog bi-quad IIR filter, in some examples, utilizes the set of variable gain amplifiers of the positive arm 122 to generate the positive coefficients and a negative (inverse) signal processed through the variable gain amplifiers of the negative arm 124 to obtain the negative coefficients.

In an example, for a given coefficient "a," one of the variable gain amplifier of the positive arm generates a positive "a" coefficient and another corresponding variable gain amplifier of the negative arm generates the negative "a"

coefficient. The undesired coefficient from each arm are set to a maximum attenuation to eliminate it leaving only the desired positive or negative version of each coefficient.

In another example, if the set of coefficients are identified as "a," "b," "c," "d," and "e," the set of variable gain amplifiers in the positive arm generate a set of positive coefficients that includes the positive "+a," "+b," "+c," "+d," and "+e." The variable gain amplifiers in the negative arm generate the set of negative coefficients for each of the coefficients, including the negative "−a," "−b," "−c," "−d," and "−e." Thus, there are ten coefficients including a negative and a positive coefficient for each of the "a," "b," "c," "d," and "e" coefficients. To reduce the number of ten coefficients from ten down to the desired five, the variable gain amplifiers are configured to set one of the coefficients from each positive and negative pair to the maximum attenuation. If the user wants the "a" coefficient to be a negative value and the "b" coefficient to be positive, the variable gain amplifiers are configured to set the positive "a" coefficient to the maximum attenuation and the negative "b" coefficient to the maximum attenuation. In this manner, the positive "a" and the negative "b" coefficients are zeroed out (rendered negligible). This does not require new methods or processes to calculate the filter coefficients mentioned previously. The same standard methods and processes for calculating digital IIR filter coefficients that are previously known and available are used in this example.

The power combiner(s) 130 include one or more hardware components for summing or combining two or more signal inputs into a single common output signal. In this example, the power combiner(s) 130 sum the positive coefficient(s) 128 from the one or more variable gain amplifier(s) 126 and the negative coefficient(s) 134 received from the one or more negative arm variable gain amplifier(s) 132. In this example, the power combiners replace the sum junctions which would be used in a digital filter.

The power combiner(s) 130 sum the various signals to generate a single analog output signal 136. The analog output signal 136 is then the fully processed analog signal.

In this manner, the analog bi-quad IIR filter nearly eliminates all of the latency inherent in digital bi-quad filters by keeping the signal of interest entirely in the analog realm, removing the need to perform ADC and then DAC. Latency of the analog bi-quad IIR filter is single-digit nanoseconds where latency in digital filter system can be a hundred nanoseconds or more. In this manner, the system operates in the GSPS frequency range with near-zero latency.

Figure 2:
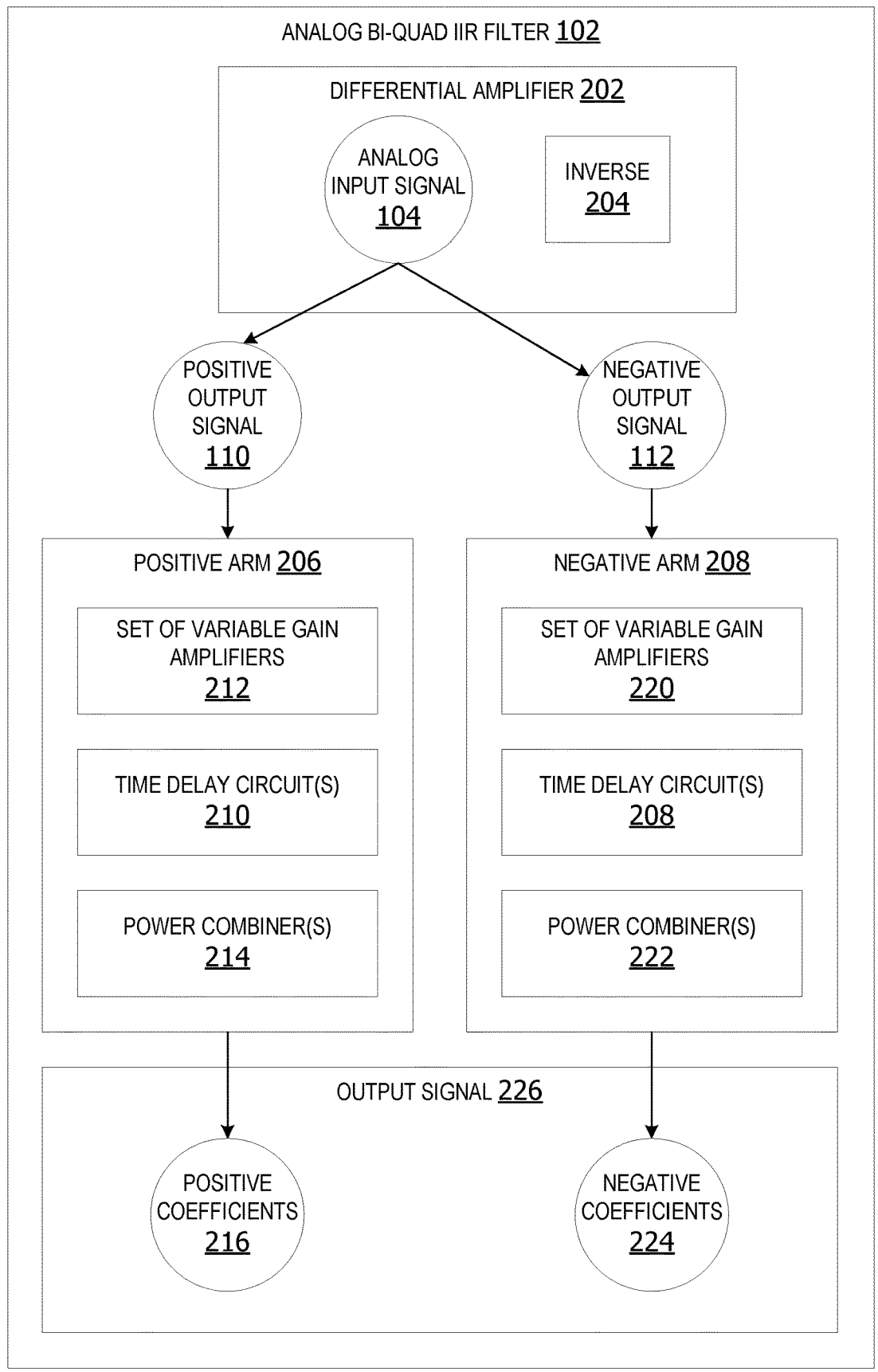
FIG. 2 is an exemplary block diagram illustrating an analog bi-quad IIR filter.

FIG. 2 is an exemplary block diagram illustrating an analog bi-quad IIR filter 102. A differential amplifier 202 receives the analog input signal 104 from a source, such as, but not limited to, the source 106 in FIG. 1. The analog input signal 104 in some examples is an RF signal.

The differential amplifier 202 is an amplifier device, such as, but not limited to, the amplifier 108 in FIG. 1. The differential amplifier 202 generates a positive output signal 110 corresponding to the received RF signal and a negative output signal 112 that is a negative of the received analog input signal 104. The negative output signal 112 in some examples is an inverse 204 of the positive output signal 110.

The positive output signal 110 is processed via a positive arm 206 of the analog bi-quad IIR filter 102 for producing positive coefficients 216. The negative output signal 112 is processed via a negative arm 208 of the analog bi-quad IIR filter 102 to establish a set of negative coefficients 224. The negative arm is a mirroring of the positive arm. The analog bi-quad IIR filter is mirrored for positive and negative with the amplifier selectively tunable with switchable time-delay for improved control and flexibility to adjust for different sample frequencies and delay times.

In some examples, the positive arm 206 includes one or more time delay circuit(s) 210 connected to a first set of variable gain amplifiers 212 to generate a time delayed positive output signal and establish the positive coefficient(s) 216. One or more power combiner(s) 214 combine each of the delayed positive output signals having the corresponding set of positive coefficients 216 generated by each of the variable gain amplifiers in the set of variable gain amplifiers 212.

The first set of variable gain amplifiers 212 can include one or more subsets of variable gain amplifiers coupled to one or more time-delay circuits. In one example, the positive output signal 110 is amplified by a first subset of variable gain amplifiers in the first set of variable gain amplifiers 212 to establish a first set of positive coefficients. A second subset of variable gain amplifiers in the set of variable gain amplifiers 212 amplify the positive output signal 110 to establish a second set of coefficients. The first subset of variable gain amplifiers and second subset of variable gain amplifiers are coupled to the power combiner(s) 214, which function as sum junctions to combine each of the delayed positive output signals having the corresponding first set of coefficients and second set of coefficients.

In other examples, the negative arm 208 includes one or more time delay circuit(s) 218 connected to a second set of variable gain amplifiers 220 to generate a time delayed positive output signal and establish the negative coefficient(s) 224. One or more power combiner(s) 222 of the negative arm 208 combine each of the delayed positive output signals having the corresponding set of negative coefficients 224 generated by each of the variable gain amplifiers in the set of variable gain amplifiers 220.

The second set of variable gain amplifiers 220 can include one or more subsets of variable gain amplifiers coupled to one or more time-delay circuits. In one example, the negative output signal 112 is amplified by a first subset of variable gain amplifiers in the second set of variable gain amplifiers 220 to establish a first set of negative coefficients. A second subset of variable gain amplifiers in the second set of variable gain amplifiers 220 amplify the negative output signal 112 to establish a second set of negative coefficients. The first subset of variable gain amplifiers and second subset of variable gain amplifiers are coupled to the power combiner(s) 222, which function as sum junctions to combine each of the delayed negative output signals having the corresponding first set of negative coefficients and second set of negative coefficients.

An output signal 226 including both positive coefficients 216 and negative coefficients 224 are output by the analog bi-quad IIR filter 102. The output signal 226 in some examples is an RF signal.

Figure 3:
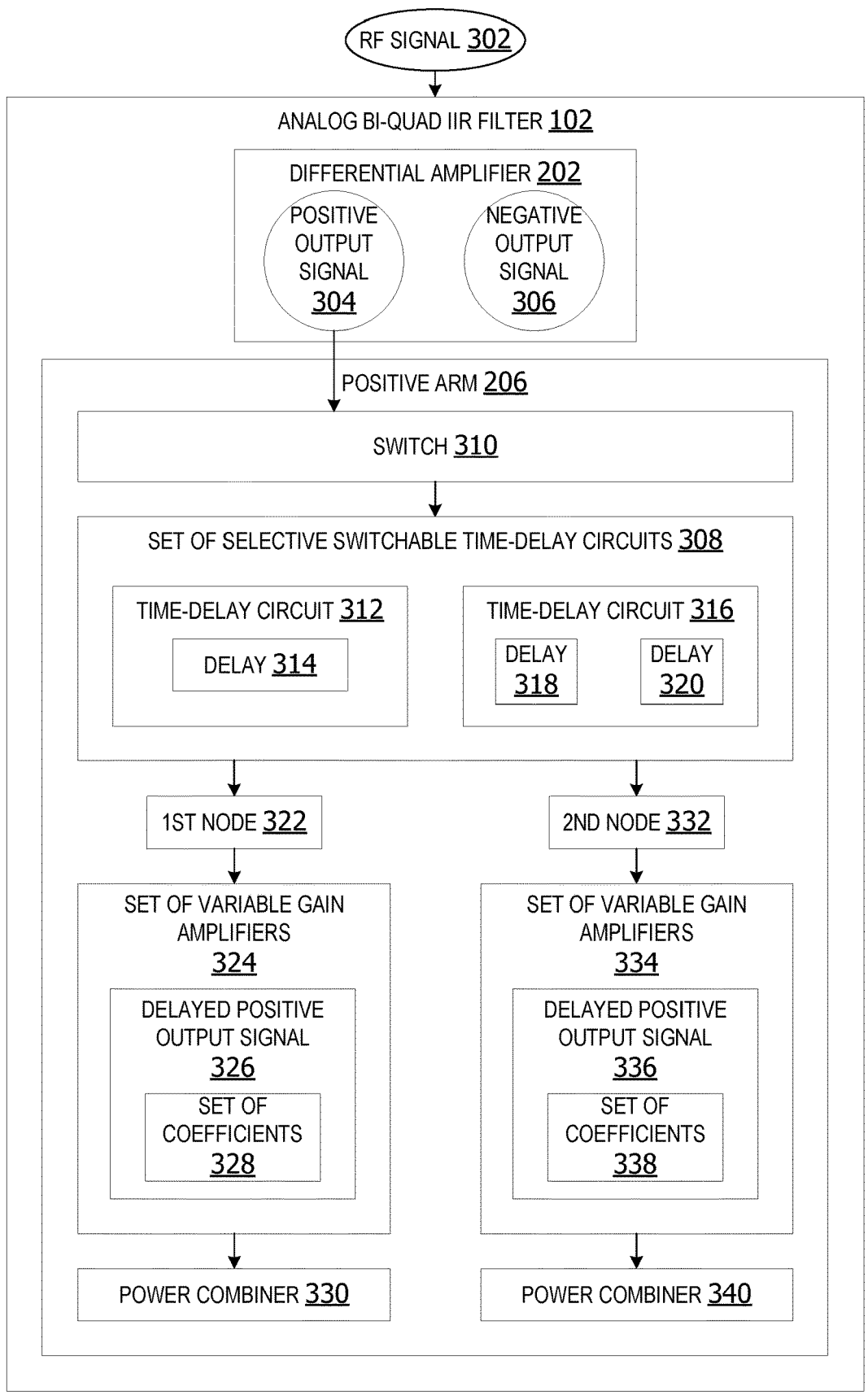
FIG. 3 is an exemplary block diagram illustrating analog bi-quad IIR filter signal processing via a positive arm of an analog bi-quad IIR filter.

FIG. 3 is an exemplary block diagram illustrating analog bi-quad IIR filter 102 RF signal 302 processing via a positive arm 206 of the analog bi-quad IIR filter 102. A differential amplifier 202 receives an RF signal 302 and generates a positive output signal 304 and a negative output signal 306 based on the RF signal.

A switch 310 device switches between one or more time-delay circuits in a set of selectively switchable time-delay circuits 308 providing a plurality of different time-delays. In this non-limiting example, the set of selectively switchable time-delay circuits 308 includes a first time-delay circuit 312 providing a delay 314. When the positive output signal 304 flows through the time-delay circuit 312, the physical time-delay circuit traces (lines) create a time-delay in the signal.

In some examples, the time-delay is selected to match the sampling frequency. In these examples, the switch 310 switches between the first time-delay circuit 312 providing the first time-delay and a second time-delay circuit 316 providing a different delay time. Thus, if the positive output signal 304 flows through the first time-delay circuit 312, the signal is delayed by a first amount of time. If the signal flows through the second time-delay circuit 316, the signal is delayed by a different, second amount of time. The switch is dynamically configurable to change the delay time to accommodate a variety of sampling frequencies.

In other examples, a single time-delay circuit 316 provides a first delay 318 or a second delay 320. The switch 310 is configured to direct the positive output signal 304 along a set of physical lines on the semiconductor chip that is of a length to delay the signal by the first delay 318 time or direct the signal along a second set of physical lines that is of a length to delay the signal by the second delay 320 time. In this manner, the delay time is adjustable to accommodate varying sampling frequencies without changing the filter architecture.

In still other examples, the delay 314 provided by the first time-delay circuit 312 is the same delay as the delay 318 provided by the second time-delay circuit 316. In other words, both the first and second time-delay circuits are configured to provide the same predetermined delay.

The first time-delay circuit 312 in this example is connected at a first node 322 to a first set of variable gain amplifiers 324 that function to amplify the delayed positive output signal 326 to establish a set of first coefficients 328. A power combiner 330 combines each of the delayed positive output signals received from the variable gain amplifiers in the first set of variable gain amplifiers 324 into a single output signal.

The second time-delay circuit 316, in this example, is connected at a second node 332 to a second set of variable gain amplifiers 334 that function to amplify the delayed positive output signal 336 to establish a second set of coefficients 338. A power combiner 340 combines each of the delayed positive output signals received from the variable gain amplifiers in the first set of variable gain amplifiers 334 into a single output signal.

Figure 4:
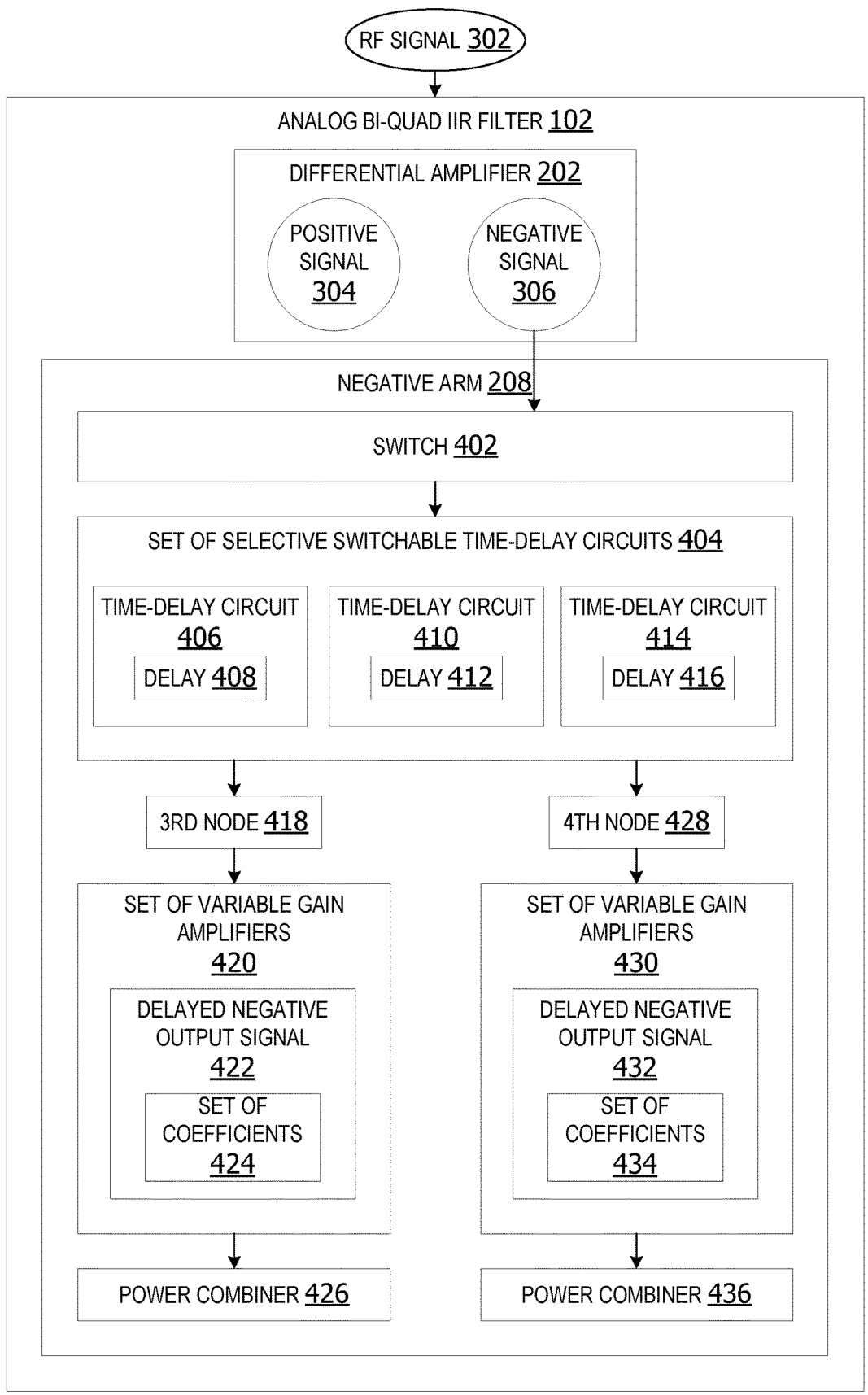
FIG. 4 is an exemplary block diagram illustrating RF signal processing via a negative arm of an analog bi-quad IIR filter.

FIG. 4 is an exemplary block diagram illustrating RF signal 302 processing via a negative arm 208 of an analog bi-quad IIR filter 102. A differential amplifier 202 receives the RF signal 302 and generates a positive output signal 304 and a negative output signal 306 based on the RF signal 302.

A switch 402 device switches between one or more time-delay circuits in a set of selectively switchable time-delay circuits 404 providing a plurality of different time-delays. In this example, the set of selectively switchable time-delay circuits 404 includes a first time-delay circuit 406 providing a first delay 408, a second time-delay circuit 410 providing a second delay 412 time and a third time-delay circuit 414 providing a third time delay 416. In this example, the delay 408 is a different delay time than the delay 412 or the delay 416. In other words, the length of the lines associated with the time-delay circuit 406 is different than the length of the lines providing the delay 412 or the delay 416.

The switch is configurable by a user to change the delay without altering the filter architecture. This enables the user to adjust the delay time to accommodate different sampling frequencies used to capture the RF signal 302.

In an example, if a user is interested in three different discrete bands or frequency groups, the filter can be set to include three different delay lines corresponding to those three frequencies. Each delay line corresponds to a different frequency or bandwidth of interest to the user. The user can easily switch between delay lines to optimize filtering associated with those three frequency groups.

In still other examples, the first time-delay circuit 406 is associated with a first variable gain amplifier, the second time-delay circuit 410 is associated with a second variable gain amplifier and the third time-delay circuit 414 is connected to a third variable gain amplifier. In this example, the delay provided by each time-delay circuit is the same delay time. In other words, the delay 408, the delay 412 and the delay 416 are the same predetermined delay corresponding to a selected sampling frequency. Each of the time-delay circuits can be configurable to provide varying delay times, but in these examples, the switch 402 switches all the time-delay circuits in the set of selectively switchable time-delay circuits 404 to cause the same predetermined delay to all the signals flowing through each of the time-delay circuits.

The first time-delay circuit 406 in this example is connected at a third node 418 to a third set of variable gain amplifiers 420. The first time-delay circuit 406 generates a first delayed negative output signal 422. The third set of variable gain amplifiers 420 function to amplify the delayed negative output signal 422 to establish a third set of coefficients 424. A power combiner 426 combines each of the delayed negative output signals received from the variable gain amplifiers in the third set of variable gain amplifiers 420 into a single output signal.

The second time-delay circuit 410, in this example, is connected at a fourth node 428 to a fourth set of variable gain amplifiers 430 that function to amplify the delayed negative output signal 432 to establish a fourth set of coefficients 434. The fourth set of coefficients are negative coefficients. A power combiner 436 combines each of the delayed negative output signals received from the variable gain amplifiers in the fourth set of variable gain amplifiers 430 into a single output signal.

Figure 5:
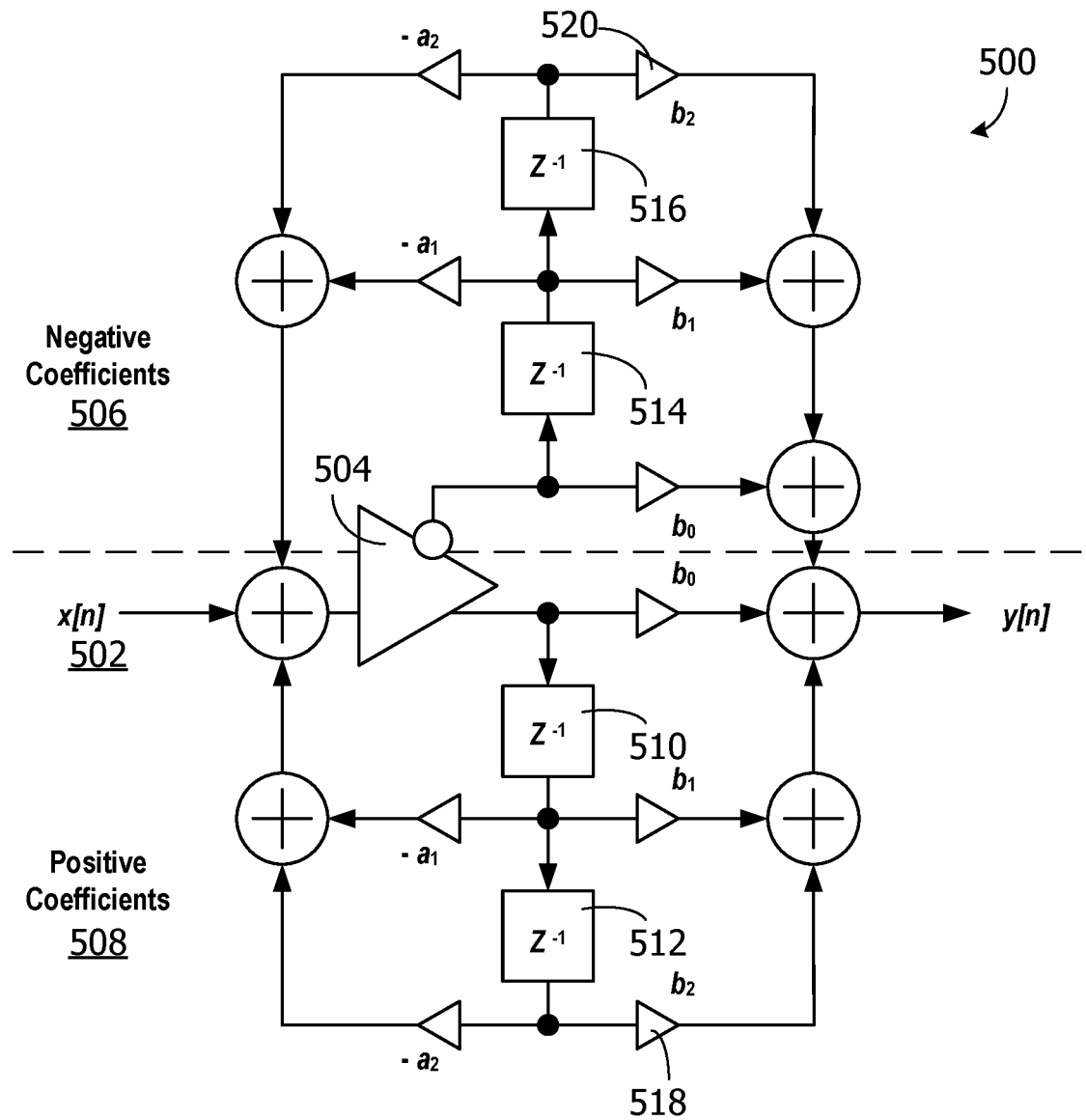
FIG. 5 is an exemplary flow graph illustrating an analog bi-quad IIR filter in a direct form two.

FIG. 5 is an exemplary flow graph 500 illustrating an analog bi-quad IIR filter in a direct form two. The analog input signal x[n] at 502 is received by an amplifier at 504. The received analog input signal 502 is converted into a positive analog input signal and a negative analog input signal. The positive output signal is processed through components on the positive arm 508 of the analog bi-quad IIR filter. The negative output signal is processed through components on the negative arm 506 of the analog bi-quad IIR filter. Thus, the analog bi-quad IIR filter includes one branch (positive arm) for establishing the positive coefficients and another branch (negative arm) for establishing the negative coefficients in an analog environment.

The positive input signal is delayed via a set of time-delay circuits. In this example, the positive branch of the analog bi-quad IIR filter includes a first time-delay circuit 510 and a second time-delay circuit 512 that delay the positive input signal by a predetermined amount. In some examples, the delay caused by the first time-delay circuit is the same predetermined delay as the delay caused by the second time-delay circuit. In other examples, each time-delay circuit is configurable to adjust or modify the delay such that the delay caused by the first time-delay circuit is adjustable to be a longer or shorter delay than the delay caused by the second time-delay circuit.

The negative branch of the analog bi-quad IIR filter includes a third time-delay circuit 514 and a fourth time-delay circuit 516 which causes a predetermined delay in the negative input signal received from the amplifier 504. In some examples, the delay caused by the third time-delay circuit 514 is the same predetermined delay as the delay caused by the fourth time-delay circuit 516. In other examples, each time-delay circuit 514 and 516 is configurable to adjust or modify the delay such that the delay caused by the third time-delay circuit 514 is a longer or shorter delay than the delay caused by the fourth time-delay circuit 516.

In this example, the analog bi-quad IIR filter includes four time-delay circuits. However, the analog bi-quad IIR filter is not limited to including four time-delay circuits. In other examples, the analog bi-quad IIR filter can include two time-delay circuits as well as five or more time-delay circuits. Where there are two time-delay circuits, one time-delay circuit is associated with the positive arm 508 and another time-delay circuit is associated with the negative arm 506.

Each time-delay circuit in other examples is a selectively switchable time-delay device. In these examples, each time-delay circuit is capable of causing two or more different delays in the signal. A switch device switches between the varying time-delay circuits to configure a desired delay time.

The analog bi-quad IIR filter includes a first set of variable gain amplifiers associated with the positive arm 508 and a second set of variable gain amplifiers associated with the negative arm 506. Each variable gain amplifier is represented by a triangle symbol. Each variable gain amplifier in the set of variable gain amplifiers on the positive arm 508 is configured to produce a positive coefficient. Each variable gain amplifier is configurable to attenuate the positive coefficient to a maximum setting to zero-out the coefficient (make it negligible) or allow the coefficient to remain unattenuated. A corresponding variable gain amplifier on the negative arm is likewise configurable to attenuate the negative coefficient to a maximum amount to make the negative coefficient negligible. Power combiner components combine each of the signals into a single signal y[n] for output.

For example, if the set of coefficients includes $a_1$, $a_2$, $b_0$, $b_1$, and $b_2$, there is a variable gain amplifier 518 on the positive arm that generates the positive coefficient for $b_2$ and a corresponding variable gain amplifier 520 that generates the corresponding negative coefficient for $b_2$. The positive coefficient and negative coefficient for $b_2$ forms a coefficient pair. One of the coefficients in the coefficient pair for $b_2$ is attenuated to a maximum amount to zero the coefficient out, leaving only one signal for coefficient $b_2$.

In another example, if an application receiving the analog output signal generated by the analog bi-quad IIR filter requires a negative coefficient for $b_2$, then the variable gain amplifier 518 is configured to attenuate the positive $b_2$ coefficient to the maximum attenuation, ensuring that only the negative $b_2$ coefficient produced by the variable gain amplifier 520 is included in the analog output signal. In this manner, the analog bi-quad IIR filter produces ten coefficients (a positive and negative coefficient for each of the five coefficients) but one coefficient from each pair is eliminated. If a coefficient is positive, then the corresponding coefficient of the negative side will be fully attenuated, and vice versa. This enables the analog system to produce both positive and negative coefficients while minimizing latency.

In still other examples, the analog bi-quad IIR filter utilizes a combination of a fixed amplifier and a variable attenuator to generate the negative and positive coefficients instead of the set of variable gain amplifiers 120. In this example, the fixed amplifier generates the coefficients and the variable attenuator attenuates unwanted or unneeded coefficients. A voltage-variable attenuator allows for continual coefficient values to be selected.

In a digital filter, the sample frequency is specified as a generic function of clock frequency, typically in radians (rad). A filter response is given between zero and pi (it), where pi is half the clock sample frequency. In the analog bi-quad IIR filter, a sample rate of 1 GSPS is sampling one time every nanosecond to get a billion samples a second. The filter is effective up to half that sample frequency. If that is at a gigahertz, the filter is most effective up to 500 megahertz (MHz). At one GSPS for a digital filter, the time delay for the analog bi-quad IIR filter is one nanosecond.

In one example, if the sample frequency is set to five hundred mega-samples per-second (MSPS), the filter is effective for a range up to 250 MHz. If the sample rate is doubled from 500 MSPS to one GSPS, that is equivalent to shrinking the time delay by half. The frequency response range increases to a range from zero up to 500 MHz A time-delay circuit can control the delay by changing the length of the physical lines (traces) and/or the materials used to fabricate the time-delay circuits on the circuit board or wafer for packaging as an integrated circuit (IC). Different properties effect how fast or slow the signal moves through the time-delay circuit. Thus, a delay of one nanosecond can be created by printing a physical delay line having a length that corresponds to one nanosecond delay on the time-delay circuit. The time-delay circuit can include multiple different time-delay physical lines having varying lengths to provide varying delays which are switchable or otherwise configurable based on the desired sampling frequency without altering the analog bi-quad IIR filter design.

In this example, the analog bi-quad IIR filter is a direct form two. However, the analog bi-quad IIR filter is not limited to implementation as direct form two. In other examples, the analog bi-quad IIR filter is implemented as a direct form one, a transpose direct form one, and/or a transpose direct form two.

Figure 6:
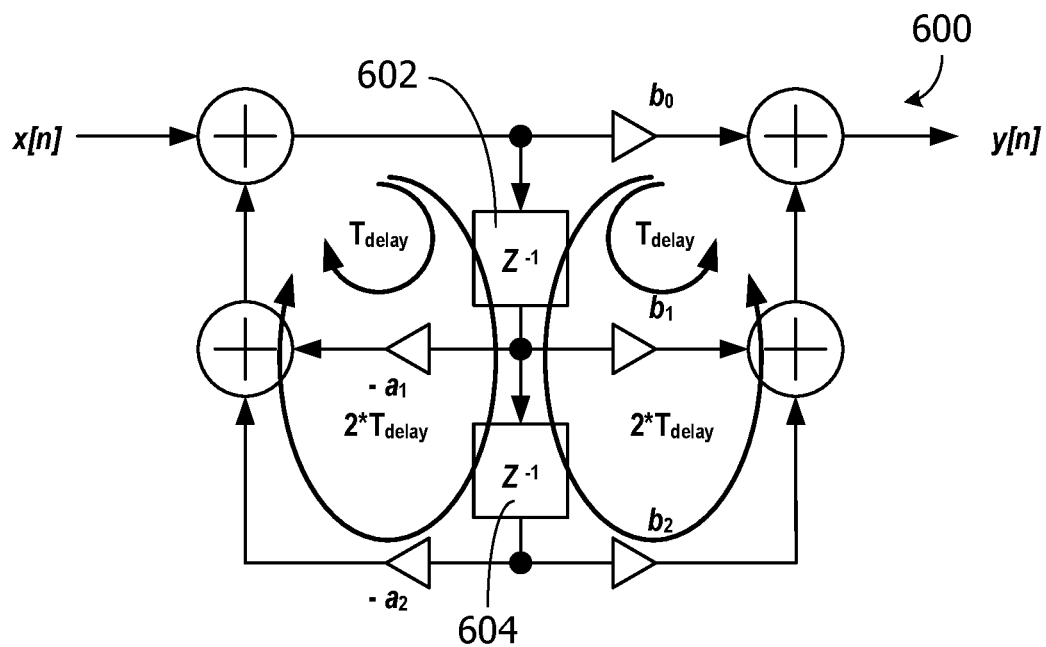
FIG. 6 is an exemplary flow graph illustrating a positive arm of an analog bi-quad IIR filter having a set of selectively switchable time-delay circuits.

FIG. 6 is an exemplary flow graph 600 illustrating a positive arm of an analog bi-quad IIR filter having fixed time-delay circuits. An analog input signal x[n] is received. In some examples, the analog input signal is an RF signal. The first time-delay circuit 602 in this example causes a first time-delay (T) for each positive output signal flowing through the first time-delay circuit 602. The second time-delay circuit 604 provides the same delay as the first time-delay (T). In this example, the delay caused by the first and second time-delay circuits generates a total of two times or double the delay time (2*T).

Figure 7:
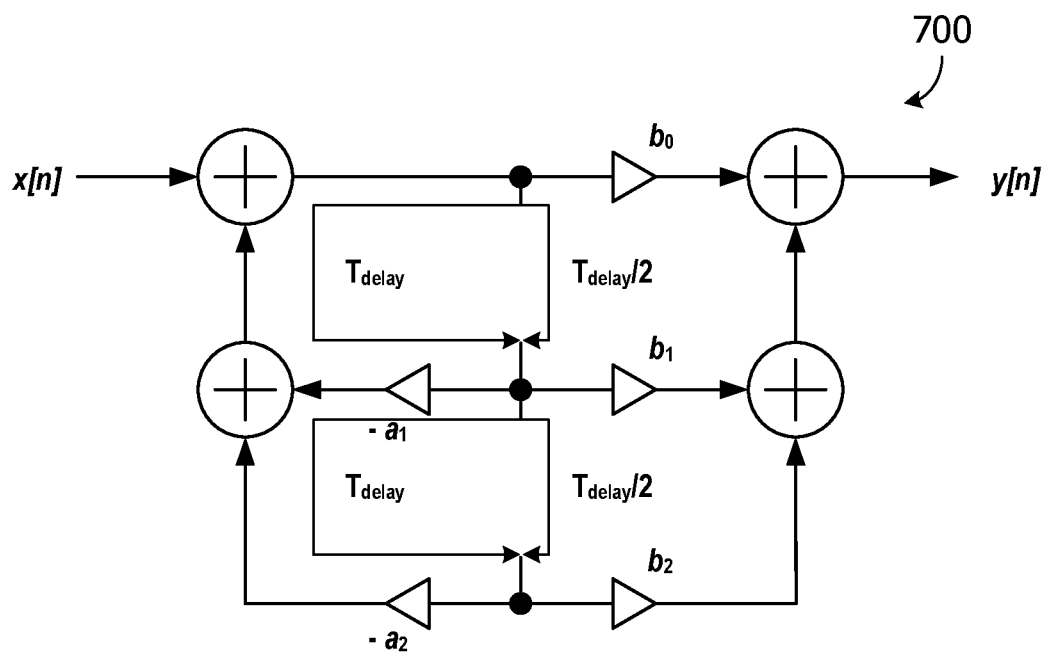
FIG. 7 is an exemplary flow graph illustrating a positive arm of an analog bi-quad IIR filter having a set of selectively switchable time-delay circuits causing varying time delays.

FIG. 7 is an exemplary flow graph 700 illustrating positive arm of an analog bi-quad IIR filter having a set of selectively switchable time-delay circuits causing varying time delays. In some examples, a first time-delay circuit causes a first delay (T) for signals flowing through the first time-delay circuit. The first time-delay circuit can also cause a shorter second delay that is half as long (T delay/2) as the first delay (T). In this example, the same time-delay circuit includes multiple lines for causing multiple different delays which are selectively switchable. Thus, a user can choose a delay time to be caused by the time-delay circuit to enable adjustment of the effective sampling frequency.

The analog bi-quad IIR filter components, in some examples, have a flat amplitude response and a linear phase response over the useful frequency spectrum (less than Nyquist). The signal delay through the components is of concern because the total delay times shown in FIG. 6 as "T-delay" and "2*T-delay" need to be maintained within a tight tolerance for the analog bi-quad IIR filter to function properly. If the same components are used in the different delay/processing loops, then their common time-delay does not impact the overall "T-delay" but adds to the latency of the system that is to be minimized in this architecture. In delay/processing loops where different components (and quantity of those components) are used, such as power combiners, the extra delay introduced by the components can be compensated for in the length of the time-delay circuit lines 602 and 604. For all of the components used, amplitude response, phase response, and time-delay can all be measured and verified on a simple circuit board test coupon relative to a straight through signal path.

If the delay through the components is minimal, and there is a fair amount of excess line that is needed to delay the signal, we can implement a switch that diverts the signal to different paths that are different lengths, effectively changing the electrical length and sample rate If the time delay in each loop is hard-wired into the circuit board, the user is unable to change effective data sampling to work on higher frequency data. A mixer can be used at the input and output to convert the input signal from its original frequency to the frequency range that the hardware operates.

Figure 8:
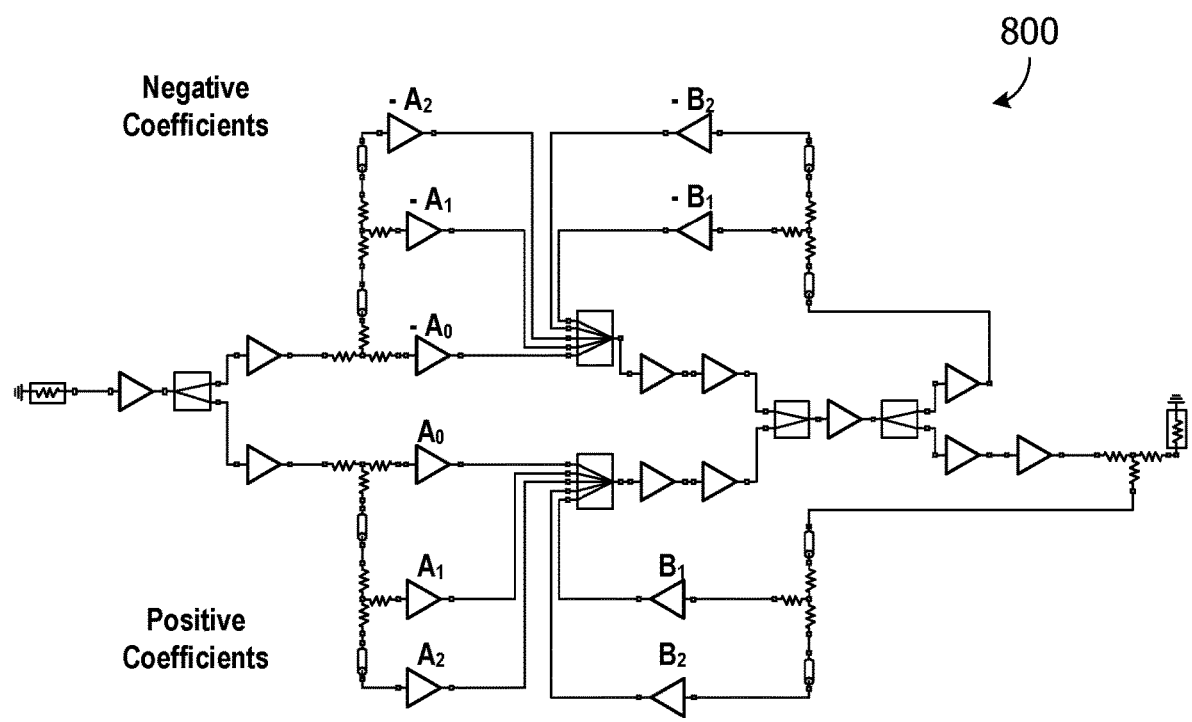
FIG. 8 is an exemplary flow graph illustrating an analog bi-quad IIR filter in a direct form one.

FIG. 8 is an exemplary flow graph 800 illustrating an analog bi-quad IIR filter in a direct form one. The analog bi-quad IIR filter includes a set of configurable time-delay circuits and a set of variable gain amplifiers which are configurable to provide an analog output signal having a set of positive and negative coefficients which are combined into a single output signal by a set of power combiners.

In this example, the analog bi-quad IIR filter is director form one. In other examples, the analog bi-quad IIR filter can be implemented as a direct form two, a transpose direct form one and/or a transpose direct form two.

Figure 9:
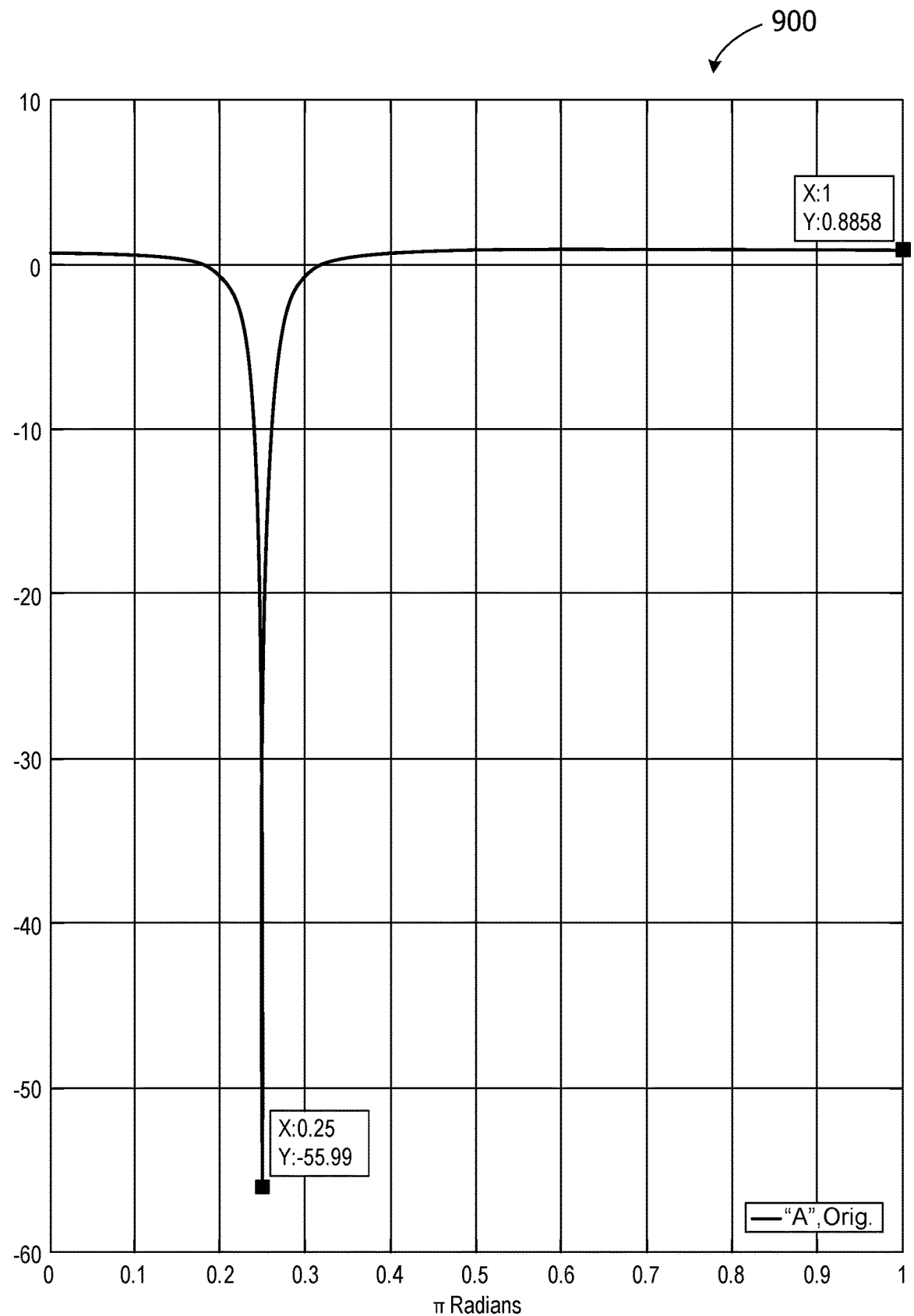
FIG. 9 is an exemplary line graph illustrating a bi-quad IIR filter response where the time-delay is set corresponding to a desired sampling frequency.

FIG. 9 is an exemplary line graph 900 illustrating an ideal bi-quad IIR filter response where the time-delay is set to correspond to a desired sampling frequency. This is an example of a bi-quad IIR filter response designed to notch out 0.125 the sample frequency. The plots are in units of radians on the x-axis and are calculated as follows:

$$0.125*2\pi=0.25\pi$$

$$\text{coef} f_{numerator}=[1,-1.414,1];$$

$$\text{coef} f_{denominator}=[1,-1.273,0.81].$$

Figure 10:
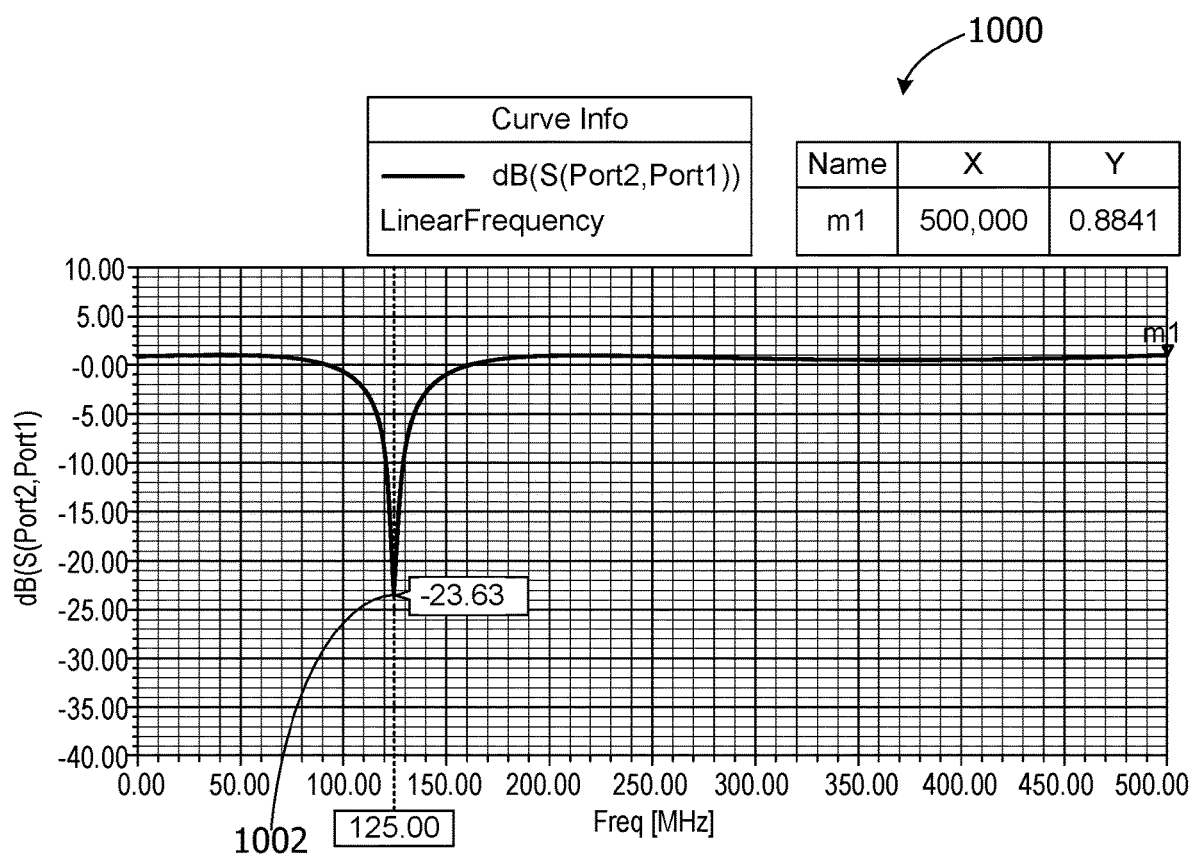
FIG. 10 is an exemplary line graph illustrating an analog IIR filter response where the time-delay is set corresponding to a desired sampling frequency of one giga-samples per second (GSPS) (inversely one nanosecond delay).

FIG. 10 is an exemplary line graph 1000 illustrating an analog IIR filter response where the time-delay is set of correspond to a desired sampling frequency of one giga-samples per second (GSPS) (inversely one nanosecond delay). This is a circuit simulation of the analog IIR filter, where the line delay has been set for a desired "sampling frequency" of 1 GSPS as follows:

$$0.125*1\text{GSPS}=125 \text{ MHz}$$

where the same coefficients are used. The notch 1002 is located at the correct frequency and is deeper than negative twenty decibels (−20 dB). The mismatch in notch depth is caused by round-off error of the amplification values (filter coefficients) assigned to the variable gain amplifiers of exemplary flow graph 800 in FIG. 8.

Figure 11:
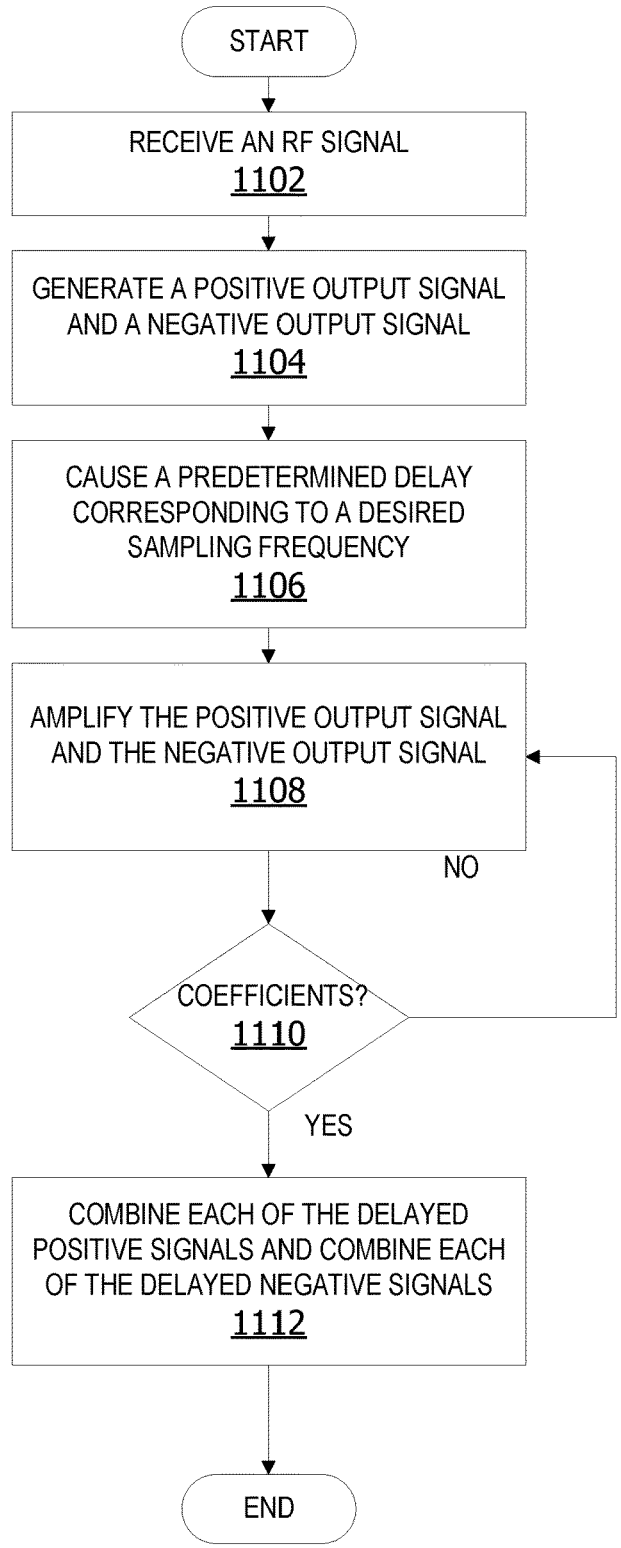
FIG. 11 is a flow chart illustrating an implementation of an analog bi-quad IIR filter modifying an input analog signal.

FIG. 11 is a flow chart illustrating an implementation of an analog bi-quad IIR filter modifying an input analog signal. An RF signal is received by the analog bi-quad IIR filter at operation 1102. A positive output signal and a negative output signal are generated by an amplifier at operation 1104. A time-delay circuit causes a predetermined delay corresponding to a desired sampling frequency at operation 1106. A set of variable gain amplifiers amplify the positive output signal and the negative output signal at operation 1108. A determination is made whether all the positive coefficients and negative coefficients are established by the variable gain amplifiers at operation 1110. If yes, a set of power combiner components combines each of the delayed positive output signals and each of the delayed negative output signals at operation 1112 into a single analog output signal.

Figure 12:
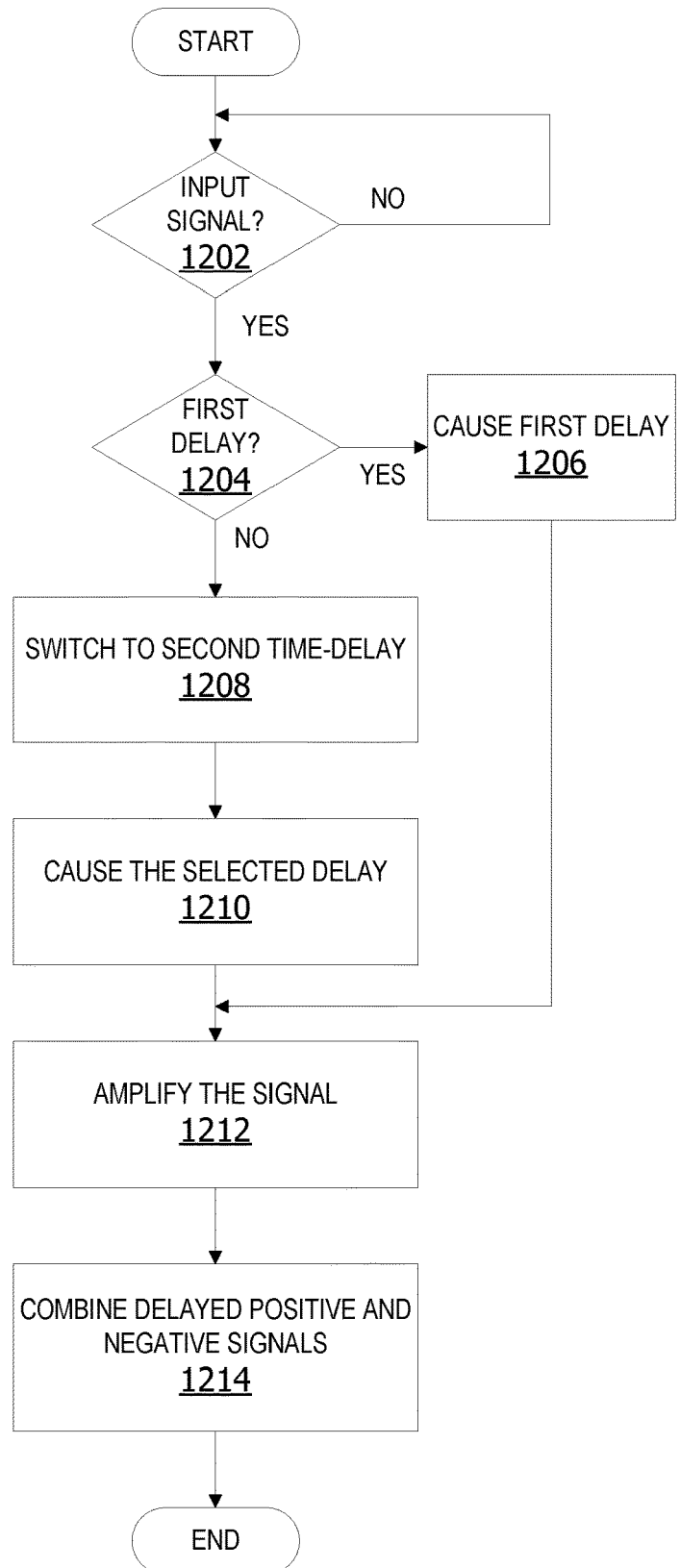
FIG. 12 is a flow chart illustrating an implementation of an analog bi-quad IIR filter generating an analog output signal having a set of positive and negative coefficients.

FIG. 12 is a flow chart illustrating an implementation of an analog bi-quad IIR filter generating an analog output signal having a set of positive and negative coefficients. If an input signal is received at operation 1202, a determination is made whether to apply a first delay at operation 1204. If yes, a first time-delay circuit causes a first delay at operation 1206. If no, a switch switches the signal to a second time-delay circuit at operation 1208. The second time-delay causes a second delay at operation 1210. A set of variable gain amplifiers amplifies the delayed signal at operation 1212. A power combiner combines the delayed positive and negative output signals at operation 1214.

The following paragraphs describe further aspects of the disclosure:

A1. An analog Infinite Impulse Response (IIR) filter for sampling a radio frequency (RF) signal, comprising:

an amplifier, functioning to receive the RF Signal and generate a positive output signal corresponding to the received RF signal and a negative output signal that is a negative of the received RF signal;

a first time-delay circuit coupled to the positive output, which functions to cause a predetermined delay corresponding to a desired sample frequency, the first time-delay circuit connected to a first set of variable gain amplifiers that function to amplify the positive output signal to establish a first set of coefficients;

a second time-delay circuit connected to a second set of variable gain amplifiers that function to amplify the positive output signal to establish a second set of coefficients, the second time-delay circuit functions to cause the predetermined delay corresponding to the desired sample frequency, wherein the first set of variable gain amplifiers and second set of variable gain amplifiers are coupled to a set of power combiner components, which function as sum junctions to combine each of the delayed positive output signals having the corresponding first set of coefficients and second set of coefficients;

a third time-delay circuit coupled to the negative output of the amplifier, which functions to cause the predetermined delay corresponding to the desired sample frequency, the third time delay circuit connected to a third set of variable gain amplifiers that function to amplify the negative output signal to establish a third set of coefficients; and a fourth time-delay circuit that functions to cause the predetermined delay corresponding to the desired sample frequency, the fourth time-delay circuit connected to a fourth set of variable gain amplifiers that function to amplify the delayed negative output signal to establish a fourth set of coefficients, wherein the third set of variable gain amplifiers and the fourth set of variable gain amplifiers are coupled to the set of power combiner components to combine each of the delayed negative output signals having the corresponding third set of coefficients and fourth set of coefficients.

A2. The analog IIR filter of claim 1, further comprising:

a power combiner in the set of power combiner components that functions to sum each of the delayed positive output signals having the corresponding first set of coefficients and second set of coefficients with each of the delayed negative output signals having the corresponding third set of coefficients and the fourth set of coefficients, wherein summation of the delayed positive output signals and the delayed negative output signals functions to reduce a total number of coefficients in an analog output signal.

A3. The analog IIR filter of claim 2, wherein the delayed positive output signals comprises five delayed positive output signals and the delayed negative output signals comprises five delayed negative output signals, and wherein the set of power combiners sums the delayed positive output signals and the delayed negative output signals to reduce the total number of coefficients from ten coefficients down to five coefficients.

A4. The analog IIR filter of claim 1, wherein the analog IIR filter is an analog bi-quad filter in direct form one.

A5. The analog IIR filter of claim 1, wherein the analog IIR filter is an analog bi-quad filter in direct form two.

A6. The analog IIR filter of claim 1, further comprising:
a set of selectively switchable time-delay circuits comprising a switch device and a first time-delay circuit, the first time-delay circuit is capable of causing a first time-delay and a second time-delay, wherein the first time-delay is a shorter length than the second time-delay, the switch device is configurable to switch between the first time-delay and the second time-delay to selectively modify the signal delay time.

A7. The analog IIR filter of claim 1, further comprising:
a maximum attenuation, wherein a configurable variable gain amplifier is configured to attenuate a selected coefficient to the maximum attenuation to render the selected coefficient negligible when summed with an opposite unattenuated coefficient by a power combiner component.

A8. A method for analog IIR filtering of an RF signal, the method comprising:
generating, by an amplifier, a positive output signal corresponding to the RF signal and a negative output signal that is a negative of the received RF signal;
causing, via a first set of time-delay circuits, a predetermined time-delay corresponding to a desired sample frequency, the first set of time-delay circuits connected to a first set of variable gain amplifiers;
amplifying, by the first set of variable gain amplifiers, the positive output signal to generate delayed positive output signals associated with a set of negative coefficients;
causing, via a second set of time-delay circuits connected to a second set of variable gain amplifiers, the predetermined time-delay corresponding to a desired sample frequency;
amplifying, by the second set of variable gain amplifiers, the negative output signal to generate delayed negative output signals associated with a set of negative coefficients; and
combining, by a set of power combiner components, each of the delayed positive output signals associated with the set of positive coefficients and each of the delayed negative output signals associated with the set of negative coefficients to generate a single analog output signal, wherein the set of power combiner components function as sum junctions.

A9. The method of claim 8, further comprising:
summing each of the delayed positive output signals with each of the delayed negative output signals, wherein summation of the delayed positive output signals and the delayed negative output signals functions to reduce a total number of coefficients in an analog output signal.

A10. The method of claim 9, wherein the delayed positive output signals comprises five positive coefficients associated with the delayed positive output signals and five negative coefficients associated with the delayed negative output signals, and further comprising:
summing the delayed positive output signals and the delayed negative output signals to reduce attenuated signals, wherein each pair of corresponding positive coefficient and opposite negative coefficient includes at least one attenuated signal which is eliminated during the summing, and wherein the single analog output signal includes five coefficients associated with unattenuated signals.

A11. The method of claim 8, further comprising:
configuring a variable gain amplifier in the first set of variable gain amplifiers to attenuate a selected positive coefficient associated with the delayed positive output signal to a maximum attenuation to render the positive coefficient negligible when summed with a corresponding unattenuated negative coefficient by a power combiner component.

A12. The method of claim 8, further comprising:
configuring a variable gain amplifier in the second set of variable gain amplifiers to attenuate a selected negative coefficient associated with the delayed negative output signal to a maximum attenuation to render the negative coefficient negligible when summed with a corresponding unattenuated positive coefficient by a power combiner component.

A13. The method of claim 8, further comprising:
selecting a time-delay from a plurality of time-delays associated with a selectively switchable time-delay circuit, the plurality of time-delays comprising a first time-delay and a second time-delay, wherein the first time-delay is a shorter delay than the second time-delay.

A14. The method of claim 8, further comprising:
amplifying the positive output signal by a first subset of variable gain amplifiers in the first set of variable gain amplifiers to establish a first set of coefficients; and
amplifying the positive output signal by a second subset of variable gain amplifiers in the first set of variable gain amplifiers to establish a second set of coefficients, wherein the first subset of variable gain amplifiers and second subset of variable gain amplifiers are coupled to a set of power combiner components, which function as sum junctions to combine each of the delayed positive output signals having the corresponding first set of coefficients and second set of coefficients.

A15. The method of claim 14, further comprising:
amplifying the negative output signal by a third subset of variable gain amplifiers in the second set of variable gain amplifiers to establish a third set of coefficients; and
amplifying the negative output signal by a fourth subset of variable gain amplifiers in the second set of variable gain amplifiers to establish a fourth set of coefficients, wherein the third subset of variable gain amplifiers and fourth subset of variable gain amplifiers are coupled to the set of power combiner components, which function as sum junctions to combine each of the delayed negative output signals having the corresponding third set of coefficients and fourth set of coefficients.

A16. An analog bi-quad IIR filter comprising:
an amplifier that receives an analog input signal, wherein the amplifier generates a positive output signal corresponding to the received analog input signal and a negative output signal that is a negative of the received analog input signal;
a first set of time-delay circuits that function to cause a configurable time-delay associated with the positive output signal corresponding to a desired sample frequency;

a first set of variable gain amplifiers coupled to the first set of time-delay circuits that amplify the positive output signal to generate delayed positive output signals associated with a set of positive coefficients;

a second set of time-delay circuits that function to cause the configurable time-delay associated with the negative output signal corresponding to the desired sample frequency;

a second set of variable gain amplifiers coupled to the second set of time-delay circuits that amplify the negative output signal to generate delayed negative output signals associated with a set of negative coefficients; and a power combiner device that combines the delayed positive output signals and the delayed negative output signals to create a single analog output signal associated with a desired set of positive and negative coefficients.

A17. The analog bi-quad IIR filter of claim 16, further comprising:

a configurable variable gain amplifier in the first set of variable gain amplifiers configured to attenuate a selected positive coefficient associated with a delayed positive output signal to a maximum attenuation to render the positive coefficient negligible when summed with a corresponding unattenuated negative coefficient by a power combiner component.

A18. The analog bi-quad IIR filter of claim 16, wherein the first set of time-delay circuits further comprises:

a first time-delay circuit in the first set of time-delay circuits coupled to the positive output, which functions to cause the predetermined delay, the first time-delay circuit connected to a first subset of variable gain amplifiers in the first set of variable gain amplifiers that function to amplify the positive output signal to establish a first set of coefficients; and a second time-delay circuit in the first set of time-delay circuits coupled to a second subset of variable gain amplifiers in the first set of variable gain amplifiers that function to amplify the positive output signal to establish a second set of coefficients, wherein the first subset of variable gain amplifiers and second subset of variable gain amplifiers are coupled to a set of power combiner components, which function as sum junctions to combine each of the delayed positive output signals having the corresponding first set of coefficients and second set of coefficients.

A19. The analog bi-quad IIR filter of claim 18, further comprising:

a third time-delay circuit in the second set of time-delay circuits coupled to the negative output of the amplifier, the third time-delay circuit connected to a third subset of variable gain amplifiers in the second set of variable gain amplifiers that function to amplify the negative output signal to establish a third set of coefficients; and a fourth time-delay circuit in the second set of time-delay circuits connected to a fourth subset of variable gain amplifiers in the second set of variable gain amplifiers that function to amplify the delayed negative output signal to establish a fourth set of coefficients, wherein the third set of variable gain amplifiers and the fourth set of variable gain amplifiers are coupled to the set of power combiner components to combine each of the delayed negative output signals having the corresponding third set of coefficients and fourth set of coefficients.

A20. The analog bi-quad IIR filter of claim 16, further comprising:

a set of selectively switchable time-delay circuits comprising a switch device and a first time-delay circuit, the first time-delay circuit is capable of causing a first time-delay and a second time-delay, wherein the first time-delay is a shorter length than the second time-delay, the switch device is configurable to switch between the first time-delay and the second time-delay to selectively modify the signal delay time.

When introducing elements of aspects of the disclosure or the implementations thereof, the articles "a," "an," "the," and "said" are intended to mean that there are one or more of the elements. The terms "comprising," "including," and "having" are intended to be inclusive and mean that there could be additional elements other than the listed elements. The term "implementation" is intended to mean "an example of" The phrase "one or more of the following: A, B, and C" means "at least one of A and/or at least one of B and/or at least one of C."

Having described aspects of the disclosure in detail, it will be apparent that modifications and variations are possible without departing from the scope of aspects of the disclosure as defined in the appended claims. As various changes could be made in the above constructions, products, and methods without departing from the scope of aspects of the disclosure, it is intended that all matter contained in the above description and shown in the accompanying drawings shall be interpreted as illustrative and not in a limiting sense.

What is claimed is:

1. An analog Infinite Impulse Response (IIR) filter for sampling a radio frequency (RF) signal, comprising:

an amplifier, functioning to receive the RF signal and generate a positive output signal corresponding to the received RF signal and a negative output signal that is a negative of the received RF signal;

a first time-delay circuit coupled to the positive output signal, which functions to cause a predetermined delay corresponding to a desired sample frequency, the first time-delay circuit connected to a first set of variable gain amplifiers that function to amplify the positive output signal to establish a first set of coefficients;

a second time-delay circuit connected to a second set of variable gain amplifiers that function to amplify the positive output signal to establish a second set of coefficients, the second time-delay circuit functions to cause the predetermined delay corresponding to the desired sample frequency, wherein the first set of variable gain amplifiers and second set of variable gain amplifiers are coupled to a set of power combiner components, which function as sum junctions to combine delayed positive output signals having the first set of coefficients and the second set of coefficients;

a third time-delay circuit coupled to negative output of the amplifier, which functions to cause the predetermined delay corresponding to the desired sample frequency, the third time delay circuit connected to a third set of variable gain amplifiers that function to amplify the negative output signal to establish a third set of coefficients; and a fourth time-delay circuit that functions to cause the predetermined delay corresponding to the desired sample frequency, the fourth time-delay circuit connected to a fourth set of variable gain amplifiers that function to amplify a delayed negative output signal to establish a fourth set of coefficients, wherein the third set of variable gain amplifiers and the fourth set of variable gain amplifiers are coupled to the set of power combiner components to combine delayed negative output signals having the third set of coefficients and fourth set of coefficients.

2. The analog IIR filter of claim 1, further comprising:

a power combiner in the set of power combiner components that functions to sum each of the delayed positive output signals having the first set of coefficients and second set of coefficients with each of the delayed negative output signals having the third set of coefficients and the fourth set of coefficients, wherein summation of the delayed positive output signals and the delayed negative output signals functions to reduce a total number of coefficients in an analog output signal.

3. The analog IIR filter of claim 2, wherein the delayed positive output signals comprises five delayed positive output signals and the delayed negative output signals comprises five delayed negative output signals, and wherein a set of power combiners sums the delayed positive output signals and the delayed negative output signals to reduce the total number of coefficients from ten coefficients down to five coefficients.

4. The analog IIR filter of claim 1, wherein the analog IIR filter is an analog bi-quad filter in direct form one.

5. The analog IIR filter of claim 1, wherein the analog IIR filter is an analog bi-quad filter in direct form two.

6. The analog IIR filter of claim 1, further comprising:

a set of selectively switchable time-delay circuits comprising a switch device and a first time-delay circuit, the first time-delay circuit is capable of causing a first time-delay and a second time-delay, wherein the first time-delay is a shorter length than the second time-delay, the switch device is configurable to switch between the first time-delay and the second time-delay to selectively modify the delay time.

7. The analog IIR filter of claim 1, wherein a configurable variable gain amplifier is configured to attenuate a selected coefficient to a maximum attenuation to render the selected coefficient negligible when summed with an opposite unattenuated coefficient by a power combiner component.

8. A method for analog Infinite Impulse Response (IIR) filtering of radio frequency (RF) signal, the method comprising:

generating, by an amplifier, a positive output signal corresponding to the RF signal and a negative output signal that is a negative of the RF signal;

causing, via a first set of time-delay circuits, a predetermined time-delay corresponding to a desired sample frequency, the first set of time-delay circuits connected to a first set of variable gain amplifiers;

amplifying, by the first set of variable gain amplifiers, the positive output signal to generate delayed positive output signals associated with a set of positive coefficients;

causing, via a second set of time-delay circuits connected to a second set of variable gain amplifiers, the predetermined time-delay corresponding to the desired sample frequency;

amplifying, by the second set of variable gain amplifiers, the negative output signal to generate delayed negative output signals associated with a set of negative coefficients; and combining, by a set of power combiner components, each of the delayed positive output signals associated with the set of positive coefficients and each of the delayed negative output signals associated with the set of negative coefficients to generate an analog output signal, wherein the set of power combiner components function as sum junctions.

9. The method of claim 8, further comprising:

summing each of the delayed positive output signals with each of the delayed negative output signals, wherein summation of the delayed positive output signals and the delayed negative output signals functions to reduce a total number of coefficients in the analog output signal.

10. The method of claim 9, wherein the delayed positive output signals comprises five positive coefficients associated with the delayed positive output signals and five negative coefficients associated with the delayed negative output signals, and further comprising:

summing the delayed positive output signals and the delayed negative output signals to reduce attenuated signals, wherein each pair of corresponding positive coefficient and opposite negative coefficient includes at least one attenuated signal which is eliminated during the summing, and wherein the single analog output signal includes five coefficients associated with unattenuated signals.

11. The method of claim 8, further comprising:

configuring a variable gain amplifier in the first set of variable gain amplifiers to attenuate a selected positive coefficient associated with the delayed positive output signal to a maximum attenuation to render the selected positive coefficient negligible when summed with a corresponding unattenuated negative coefficient by a power combiner component.

12. The method of claim 8, further comprising:

configuring a variable gain amplifier in the second set of variable gain amplifiers to attenuate a selected negative coefficient associated with the delayed negative output signal to a maximum attenuation to render the negative coefficient negligible when summed with a corresponding unattenuated positive coefficient by a power combiner component.

13. The method of claim 8, further comprising:

selecting a time-delay from a plurality of time-delays associated with a selectively switchable time-delay circuit, the plurality of time-delays comprising a first time-delay and a second time-delay, wherein the first time-delay is a shorter delay than the second time-delay.

14. The method of claim 8, further comprising:

amplifying the positive output signal by a first subset of variable gain amplifiers in the first set of variable gain amplifiers to establish a first set of coefficients; and amplifying the positive output signal by a second subset of variable gain amplifiers in the first set of variable gain amplifiers to establish a second set of coefficients, wherein the first subset of variable gain amplifiers and second subset of variable gain amplifiers are coupled to a set of power combiner components, which function as sum junctions to combine each of the delayed positive output signals having the first set of coefficients and second set of coefficients.

15. The method of claim 14, further comprising:

amplifying the negative output signal by a third subset of variable gain amplifiers in the second set of variable gain amplifiers to establish a third set of coefficients; and amplifying the negative output signal by a fourth subset of variable gain amplifiers in the second set of variable gain amplifiers to establish a fourth set of coefficients, wherein the third subset of variable gain amplifiers and fourth subset of variable gain amplifiers are coupled to the set of power combiner components, which function as sum junctions to combine each of the delayed negative output signals having the third set of coefficients and fourth set of coefficients.

16. An analog bi-quad Infinite Impulse Response (IIR) filter comprising:
an amplifier that receives an analog input signal, wherein the amplifier generates a positive output signal corresponding to the analog input signal and a negative output signal that is a negative of the received analog input signal;
a first set of time-delay circuits that function to cause a configurable time-delay associated with the positive output signal corresponding to a desired sample frequency;
a first set of variable gain amplifiers coupled to the first set of time-delay circuits that amplify the positive output signal to generate delayed positive output signals associated with a set of positive coefficients;
a second set of time-delay circuits that function to cause the configurable time-delay associated with the negative output signal corresponding to the desired sample frequency;
a second set of variable gain amplifiers coupled to the second set of time-delay circuits that amplify the negative output signal to generate delayed negative output signals associated with a set of negative coefficients; and
a power combiner device that combines the delayed positive output signals and the delayed negative output signals to create an analog output signal associated with a desired set of positive and negative coefficients.

17. The analog bi-quad IIR filter of claim 16, further comprising:
a configurable variable gain amplifier in the first set of variable gain amplifiers configured to attenuate a selected positive coefficient associated with a delayed positive output signal to a maximum attenuation to render the selected positive coefficient negligible when summed with a corresponding unattenuated negative coefficient by a power combiner component.

18. The analog bi-quad IIR filter of claim 16, wherein the first set of time-delay circuits further comprises:
a first time-delay circuit in the first set of time-delay circuits coupled to positive output, which functions to cause a predetermined delay, the first time-delay circuit connected to a first subset of variable gain amplifiers in the first set of variable gain amplifiers that function to amplify the positive output signal to establish a first set of coefficients; and
a second time-delay circuit in the first set of time-delay circuits coupled to a second subset of variable gain amplifiers in the first set of variable gain amplifiers that function to amplify the positive output signal to establish a second set of coefficients, wherein the first subset of variable gain amplifiers and second subset of variable gain amplifiers are coupled to a set of power combiner components, which function as sum junctions to combine each of the delayed positive output signals having the first set of coefficients and second set of coefficients.

19. The analog bi-quad IIR filter of claim 18, further comprising:
a third time-delay circuit in the second set of time-delay circuits coupled to negative output of the amplifier, the third time-delay circuit connected to a third subset of variable gain amplifiers in the second set of variable gain amplifiers that function to amplify the negative output signal to establish a third set of coefficients; and
a fourth time-delay circuit in the second set of time-delay circuits connected to a fourth subset of variable gain amplifiers in the second set of variable gain amplifiers that function to amplify the delayed negative output signal to establish a fourth set of coefficients, wherein a third set of variable gain amplifiers and a fourth set of variable gain amplifiers are coupled to the set of power combiner components to combine each of the delayed negative output signals having the third set of coefficients and fourth set of coefficients.

20. The analog bi-quad IIR filter of claim 16, further comprising:
a set of selectively switchable time-delay circuits comprising a switch device and a first time-delay circuit, the first time-delay circuit is capable of causing a first time-delay and a second time-delay, wherein the first time-delay is a shorter length than the second time-delay, the switch device is configurable to switch between the first time-delay and the second time-delay to selectively modify the delay time.

* * * * *